(12) United States Patent  
Kenkare et al.

(10) Patent No.: US 9,647,453 B2  
(45) Date of Patent: May 9, 2017

(54) DUAL SUPPLY MEMORY

(71) Applicants: Prashant Kenkare, Austin, TX (US); Brian Millar, Austin, TX (US); Frank Philip Helms, Austin, TX (US)

(72) Inventors: Prashant Kenkare, Austin, TX (US); Brian Millar, Austin, TX (US); Frank Philip Helms, Austin, TX (US)

(73) Assignee: SAMSUNG ELECTRONICS CO., LTD. (KR)

( * ) Notice: Subject to any disclaimer, the term of this patent is extended or adjusted under 35 U.S.C. 154(b) by 64 days.

(21) Appl. No.: 14/158,759

(22) Filed: Jan. 17, 2014

(65) Prior Publication Data

US 2015/0036446 A1 Feb. 5, 2015

Related U.S. Application Data

(60) Provisional application No. 61/861,946, filed on Aug. 2, 2013.

(51) Int. Cl.
*H02J 1/00* (2006.01)
*G11C 5/14* (2006.01)

(52) U.S. Cl.
CPC ............. *H02J 1/00* (2013.01); *G11C 5/147* (2013.01); *Y10T 307/391* (2015.04)

(58) Field of Classification Search
CPC ........................................ G11C 5/14
USPC ........................................ 365/226
See application file for complete search history.

(56) References Cited

U.S. PATENT DOCUMENTS

| | | | | |
|---|---|---|---|---|
| 7,050,049 B2* | 5/2006 | Byun | ..................... | G09G 5/003 345/211 |
| 7,327,630 B2* | 2/2008 | Park | ..................... | G11C 11/417 323/313 |
| 7,523,373 B2* | 4/2009 | Russell | ..................... | G11O 5/147 324/750.3 |
| 7,679,948 B2 | 3/2010 | Park et al. | | |
| 8,072,237 B1* | 12/2011 | Rahim | ............. | H03K 19/17784 326/101 |
| 8,884,683 B1* | 11/2014 | Helms | ..................... | G06F 1/206 327/534 |
| 8,988,140 B2* | 3/2015 | Graf | ..................... | G05F 1/46 323/267 |

(Continued)

*Primary Examiner* — Anthan Tran
*Assistant Examiner* — Mushfique Siddique
(74) *Attorney, Agent, or Firm* — Renaissance IP Law Group LLP (57) ABSTRACT

According to one general aspect, an apparatus may include a first power supply configured to generate a first power signal having one of a plurality of voltages, and a second power supply configured to generate a second power signal that includes a voltage equal to or higher than a voltage of the first power signal. The apparatus may include a first electrical circuit configured to be powered by the first power supply. The apparatus may also include a power mode controller configured to: determine the voltage of the first power signal during the next power state, and generate a selector control signal based upon the voltage of the first power signal. The apparatus may also include a power supply selector configured to dynamically electrically couple a second electrical circuit with either the first power signal or the second power signal, based upon the selector control signal.

27 Claims, 8 Drawing Sheets

(56) References Cited

U.S. PATENT DOCUMENTS

| | | | |
|---|---|---|---|
| 2006/0192596 A1* | 8/2006 | Ramaraju | H03K 19/0016 327/55 |
| 2008/0162951 A1* | 7/2008 | Kenkare | G06F 1/3225 713/300 |
| 2010/0072816 A1* | 3/2010 | Kenkare | H02J 1/102 307/24 |
| 2010/0185879 A1* | 7/2010 | Shaver | G06F 1/263 713/300 |
| 2010/0191990 A1* | 7/2010 | Zhang | G06F 12/0864 713/320 |
| 2010/0246298 A1* | 9/2010 | Zhang | G11C 5/147 365/200 |
| 2010/0309736 A1* | 12/2010 | Russell | G11C 11/413 365/189.011 |
| 2010/0322027 A1* | 12/2010 | Russell | G11C 11/413 365/227 |
| 2012/0081975 A1* | 4/2012 | Yamaki | G11C 11/417 365/189.07 |
| 2013/0166926 A1* | 6/2013 | Yamamizu | G03G 15/5079 713/300 |

* cited by examiner

DUAL SUPPLY MEMORY

CROSS-REFERENCE TO RELATED APPLICATION

This application claims priority under 35 U.S.C. §119 to Provisional Patent Application Ser. No. 61/861,946, entitled Dual Supply Memory filed on Aug. 2, 2013. The subject matter of this earlier filed application is hereby incorporated by reference.

TECHNICAL FIELD

This description relates to providing power to a logic device, and more specifically providing power to a memory device.

BACKGROUND

Typically, computing devices make use of memory cells to store pieces of information. These memory cells are generally arranged in rows and columns. Often horizontal lines or signals connect each row and are generally known as wordlines. Often each column of memory cells includes two bitlines or signals, each connected to every other storage cell in the column. To access (read and/or write) a particular bit of data, the wordline of the memory cell associated with the bit of data is asserted and the associated pair of bitlines are appropriately configured to either allow a read or write operation to the selected memory cell.

Generally, computing devices or more specifically integrated circuits have been reducing their power consumption. Often this is accomplished, in part, by reducing the voltage of the power signal applied to the computing device or integrated circuit. However, generally memory devices function better at higher voltages. Therefore, there is often a tradeoff between lowering the power consumption of a computing device or integrated circuit and maintaining robust memory operation.

SUMMARY

According to one general aspect, an apparatus may include a first power supply configured to generate a first power signal having one of a plurality of voltages based upon a selected power state. The apparatus may include a second power supply configured to generate a second power signal that includes a voltage equal to or higher than a voltage of the first power signal. The apparatus may include a first electrical circuit configured to be powered by the first power supply. The apparatus may further include a second electrical circuit configured to be powered by either the second power signal or the first power signal. The apparatus may also include a power mode controller. The power mode controller may be configured to: receive a signal indicating a next power state, determine the voltage of the first power signal during the next power state, and generate a selector control signal based upon a comparison of the voltage of the first power signal during the next power state to a predefined voltage level. The apparatus may also include a power supply selector configured to dynamically electrically couple the second electrical circuit with either the first power signal or the second power signal, based at least in part upon the selector control signal.

According to another general aspect, a method may include receiving a signal that indicates a next power state. The method may also include determining a magnitude of a first power signal associated with the next power state. The method may include powering a first electrical circuit with the first power signal. The method may include comparing the magnitude of the first power signal to a predetermined magnitude level. The method may further include dynamically electrically coupling a second electrical circuit with either the first power signal or a second power signal, based at least in part upon the magnitude of the first power signal compared to a predetermined magnitude level.

According to another general aspect, a system may include a power supply, a memory, a power mode controller, and a power supply selector. The power supply may include a first power generator configured to generate a first power signal having one of a plurality of voltages based upon a selected power state, and a second power generator configured to generate a second power signal that includes a voltage equal to or higher than a voltage of the first power signal. The memory may include a first portion of the memory configured to be powered by the first power signal, and a second portion of the memory configured to be powered by either a second power signal or the first power signal. The power mode controller may be configured to: receive a signal indicating a next power state, determine the voltage of the first power signal during the next power state, and generate a selector control signal based upon a comparison of the voltage of the first power signal during the next power state to a predefined voltage level. The power supply selector may be configured to dynamically electrically couple the second portion of the memory with either the second power signal or the first power signal, based at least in part upon the selector control signal.

According to another general aspect, an apparatus may include a first power supply configured to generate a first power signal, and a second power supply configured to generate a second power signal that includes a voltage equal to or higher than a voltage of the first power signal. The apparatus may also include a first electrical circuit configured to be powered by the first power supply, and a second electrical circuit configured to be powered by either the second power signal or the first power signal. The apparatus may include a power supply selector configured to dynamically electrically couple the second electrical circuit with either the first power signal or the second power signal, based at least in part upon the voltage of the first power supply signal relative to the voltage of the second power supply signal.

The details of one or more implementations are set forth in the accompanying drawings and the description below. Other features will be apparent from the description and drawings, and from the claims.

A system and/or method for providing power to a logic device, substantially as shown in and/or described in connection with at least one of the figures, as set forth more completely in the claims.

BRIEF DESCRIPTION OF THE DRAWINGS

Like reference symbols in the various drawings indicate like elements.

DETAILED DESCRIPTION

Figure 1:
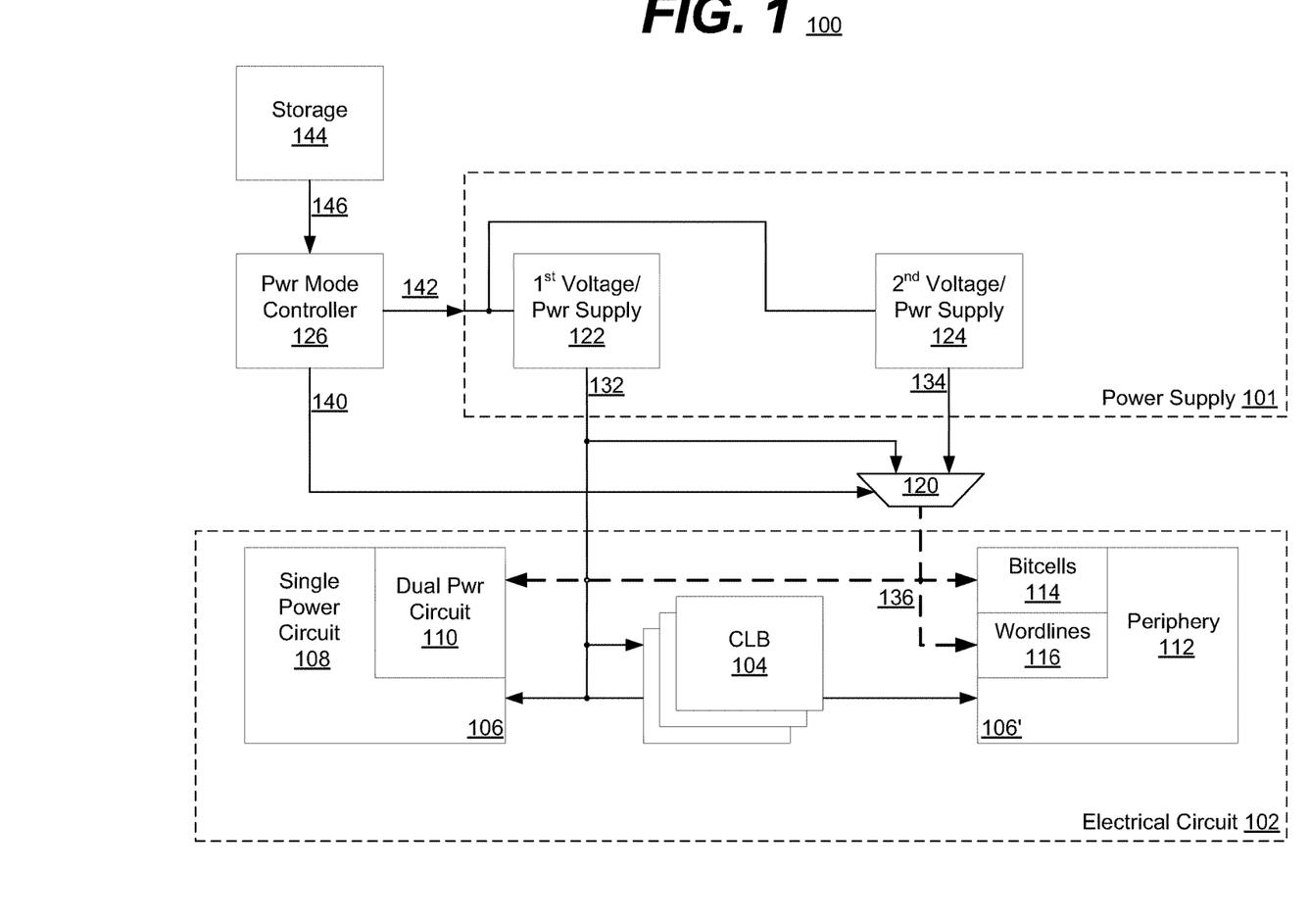
FIG. 1 is a block diagram of an example embodiment in accordance with the disclosed subject matter.

FIG. 1 is a block diagram of an example embodiment of a system 100 in accordance with the disclosed subject matter. In various embodiments, the system 100 may include a processor or electrical circuit 102, a power supply 101, a power mode controller 126, and storage 144 that is coupled to the power mode controller 126. In such an embodiment, the processor 102 may receive one or more power signals (e.g., signals 132 and 134, etc.) from the power supply 101.

In some embodiments, the power supply 101 and processor or electrical circuit 102 may be integrated into one single component (e.g., a system-on-a-chip (SoC), an integrated circuit, etc.). In another embodiment, the electrical circuit 102 and the power supply 101 may be separate devices. In yet another embodiment, the electrical circuit 102 may include a plurality of devices (e.g., chipset components, memory devices, processor, etc.). In one embodiment, the power supply 101 may receive power from an external source (e.g., a battery, a wall power outlet, another power supply, etc.). In such an embodiment, the power supply 101 may be configured to regulate or otherwise manage the power originally provided by the external source. It is understood that the above are merely a few illustrative examples to which the disclosed subject matter is not limited.

In various embodiments, the drive towards lower power consumption by electrical devices (e.g., system 100, etc.) often results in electrical circuits (e.g., electrical circuit 102, etc.) operating at lower voltages. Frequently, the lowest operating voltage (Vmin) for an electrical circuit or processor is set by various memory components (e.g., a static random access memory (SRAM), the memory 106, etc.). In various embodiments, the Vmin required by the memory components is often higher than the minimum voltage needed or desirable for the combinatorial logic components (e.g., AND gates, OR gates, etc.). In one embodiment, this disparity in the minimum voltage requirements of the two type of electrical circuits may be reconciled or ameliorated by supplying a first voltage or power supply to the electrical circuits that have the lower minimum voltage requirement and then a second, more powerful or higher voltage power supply to the electrical circuits that have the higher minimum voltage requirement (e.g., the memories, etc.).

In the illustrated embodiment, the electrical circuit 102 may include one or more combinatorial logic blocks (CLBs) 104. In various embodiments, these CLBs 104 may include various Boolean logic gates or logic devices (e.g., NAND gates, NOR gates, flip-flops, multiplexers, repeaters, etc.). In some embodiments, these CLBs 104 may be arranged in a pipelined fashion and may include various execution units (e.g., floating-point unit (FPU), instruction fetch unit (IFU), load-store unit (LSU), etc.).

In one embodiment, these CLBs 104 may operate at a first or lower minimum voltage. In such an embodiment, the power supply 101 may include a first voltage generator or power supply 122. In various embodiments, this first voltage or power supply 122 may be configured to generate the power signal 132 (Vdd) of a first voltage. In such an embodiment, the first power supply or signal 132 may be provided to or supplied to the CLBs 104. The CLBs 104 may in turn make use of Vdd 132. In various embodiments, the Vdd 132 may be employed as the power rail(s) for the logic gates, transistors, or other components of the CLBs 104. In various embodiments, the CLB 104 may include any electrical circuit that is configured to operate with the first voltage or power signal 132.

In the illustrated embodiment, the electrical circuit 102 may include one or more electrical circuits 106 that are configured to operate at a higher or greater voltage or power amount. In one embodiment, the power supply 101 may include a second voltage generator or power supply 124. In various embodiments, this second voltage generator or power supply 124 may be configured to generate a power signal 134 (Vdd_High) of second voltage. In such an embodiment, the second power supply or signal 134 may be provided to or supplied to the high-power circuits 106 or 106'. The high-power circuits 106 at least in part may in turn make use of Vdd_High 134. In various embodiments, the Vdd_High 134 may be employed as the power rail(s) for the logic gates, transistors, or other components of the high-power circuits 106.

In such an embodiment, the lower powered circuits 104 may no longer be constrained to the higher voltage (Vdd_High) power supply 134, and may operate at the lower voltage (Vdd) power supply 132. In such an embodiment, this may conserve or reduce the consumption of power by the electrical circuit 102.

In the illustrated embodiment, to further reduce the consumption of power (or for other reasons), the high power circuits 106 may be partitioned into a low power portion 108 (described later as a "single power circuit") and a high power portion 110 (described later as a "dual power circuit"). In such an embodiment, the low power portion 108 may operate using Vdd 132, while the high power portion 110 may be configured to operate using Vdd_High 134.

In a specific embodiment, the high power circuit 106' may include an embedded memory circuit (e.g., a static random access memory (SRAM), dynamic RAM (DRAM), NAND memory, etc.). In such an embodiment, the memory circuit 106' may be configured to store data. As described above, the memory circuit 106' may include bitcells 114, wordlines 116, and various periphery logic 112 (e.g., address decoding logic, Boolean logic, etc.). In the illustrated embodiment, the periphery logic 112 may be configured to be powered by a power supply with a lower voltage level than the bitcells 114 and the wordlines 116. In such an embodiment, the periphery logic 112 may be powered by Vdd 132 and the bitcells 114 & wordlines 116 may be powered by Vdd_High 134. It is understood that the above is merely one illustrative example to which the disclosed subject matter is not limited.

In various embodiments, the power supply 101 may be configured to dynamically alter or change the signal supplied by, at least, the first power supply 122. In such an embodiment, this may occur due to changes in the amount of work the CLBs 104 are expected to perform (e.g., computational load, etc.), the heat characteristics of the electrical circuit 102 (e.g., thermal throttling, etc.), or due to explicit instructions to change operational modes. It is understood that the above are merely a few illustrative examples to which the disclosed subject matter is not limited.

In one embodiment, the power supply 101 may be controlled by a power mode controller 126 using regulator control signals 142. In various embodiments, the power mode controller 126 may be configured to change the first power signal 132 as a result of dynamically changing voltage and/or clock frequency supplied to electrical circuit 102. In various embodiments, such dynamically changing behavior may be referred to by terms such as DVFS (Dynamic Voltage Frequency Scaling), DVS (Dynamic Voltage Scaling), and DFS (Dynamic Frequency Scaling). In one such embodiment, the power mode controller 126 may be configured to raise or lower the voltage level of Vdd 132 according to a set of predefined criteria or rules.

For example, these predefined criteria could include the definition of various "power states" for the electrical circuit 102 such that each power state represents a given choice of operating frequency, magnitude of the first voltage supply 122, and magnitude of the second voltage supply 124. Such details for the various power states can be stored in Storage 144 that can include either volatile memory or non-volatile memory or a combination of both volatile and non-volatile memory. The determination of such details associated with the various power states can be made during the design phase and then stored in a non-volatile memory, such as, for example, a ROM (Read-Only-Memory).

Alternatively, some or part of such details can be determined as a result of testing fabricated silicon that suggests optimum values for certain characteristics such as the magnitudes of the first voltage supply 122 and the second voltage supply 124. As seen in FIG. 1, the first voltage supply 122 and the second voltage supply 124 may be controlled by input signals 142 provided by the power mode controller 126. In turn, power mode controller 126 may receive one or more signals that includes information or details such as magnitude of the first voltage supply 122 and magnitude of the second voltage supply 124 via data signals 146 provided by storage 144. One component of storage 144 could be represented by "One Time Programmable" memory such as electrical fuses, which can be programmed following silicon testing. Another component of storage 144 could be a Static Random Access Memory (SRAM), which may be loaded by software.

Likewise, the power mode controller 126 may be configured to raise or lower the frequency of electrical circuit 102 and/or duty cycle of Vdd 132 according to another set of predefined criteria or rules. In yet another embodiment, the power mode controller 126 may be configured to place the electrical circuit 102, in whole or in part, in one of a plurality of power or operational modes (e.g., "On", "Off", "Standby", "Low power", "Battery", etc.). Each of these operational modes may be associated with a particular voltage level of the Vdd 132 and/or Vdd_High 134. In various embodiments, the power mode controller 126 may be configured to generate an operational mode or power generation signal (see FIG. 4, etc.) that may instruct various CLBs 104 or circuits 106 and 106' which power or operational mode they should be operating in. It is understood that the above are merely a few illustrative examples to which the disclosed subject matter is not limited.

As described above, in various embodiments, there may be a substantial voltage difference between the first power signal Vdd 132 and the second power signal Vdd_High 134. In such an embodiment, the first and second power supplies 122 and 124 may include respective voltage regulators (not shown) and may be configured to compensate for any difference between the two voltage regulators. This may include, but is not limited to, differences in the direct current (DC) offset of the two signals 132 & 134, any transient behavior caused, for example, due to differing current loads, etc. The second power supply 124 may be configured to generate Vdd_High 134 such that it includes a voltage level higher than Vdd 132 plus a compensating factor or delta value. In various embodiments, this delta value may be substantially equal to the voltage or IR drop caused by the respective power bus and any regulator variations.

In various embodiments, in addition to the aforementioned Vmin, there may also be a maximum voltage (Vmax). In such an embodiment, the Vmax may be the highest voltage that a circuit may be subjected to or operated at for an extended period of time before the transistor or electrical circuit's operating life is shortened. This Vmax may depend upon the process used to fabricate the electrical circuit and the operational tolerances selected.

In various embodiments, the voltage level of Vdd 132 may rise. In some embodiments, this may occur due to a change in operating mode, DVFS, etc. In such an embodiment, the second power supply 124 may be configured to adjust the Vdd_High 134 based upon the increased Vdd 132 plus the voltage delta, as described above. In some embodiments, this may result in Vdd_High 134 equaling or going beyond Vmax. In various embodiments, this may be compensated for by reducing the operating frequency of the electrical circuit 102, and hence Vdd 132 and Vdd_High 134 or via another scheme.

However, in the illustrated embodiment, the system 100 may include a power supply selector 120. In such an embodiment, the power supply selector 120 may be configured to determine whether the high power portion 110 of the circuit 106 receives the first signal Vdd 132 or the second signal Vdd_High 134. The configuration of the power supply selector 120 can be enabled with selector control signal 140. In various embodiments, the power supply selector 120 may be configured to make its determination based upon a threshold value (e.g., the power states stored within the storage 144, the previously mentioned delta, a predefined value, etc.). In various embodiments, the power supply selector 120 may be configured to make this determination based upon the relative voltages of the two signals 132 and 134.

For example, silicon test results or design analysis could be used for defining a threshold value "V1" which would be stored in storage 144. In one embodiment, Power Mode Controller 126 receives information on the next desired "power state" and uses data signal(s) 146 from storage 144 to determine the desired magnitude of the first voltage supply 122 for the next desired "power state". Power Mode Controller 126 can then dynamically compare this desired magnitude of the first voltage supply 122 against the stored value "V1". For the case where Vdd 132 exceeds V1, the controller 126 can make the determination that the Bitcells 114 and Wordlines 116 in memory circuit 106' will operate using the signal Vdd 132. The power supply selector signal 140 is then driven to the appropriate logic value such that signal 136 is electrically coupled to signal 132. Alternatively, for the case where Vdd 132 is less than or equal to V1, the controller 126 can make the determination that the Bitcells 114 and Wordlines 116 in memory circuit 106' will operate using Vdd_High 134. The control signals 142 are then set to the appropriate values such that the second power supply 124 is ramped up to a magnitude that is sufficiently higher relative to Vdd 132. The exact difference between the $1^{st}$ power supply 122 and the second power supply 124 may be based on assumed regulator tolerances, regulator behavior under transient current demands, and the requirements of the memory cells such that they operate in a robust manner in terms of reading, writing, and retaining data.

After the second power supply 124 has been ramped up to the appropriate value, the power supply selector signal 140 may be driven to the appropriate value such that signal 136 is electrically coupled to signal 134. Those skilled in the art will recognize that the memory operation needs to be carefully managed while transitioning signal 136 between Vdd 132 and Vdd_High 134 or vice versa. In some cases, it would be desirable to halt memory read or write accesses to avoid improper memory operation, while in other cases memory read or write accesses can occur robustly even while the voltage supplies are transitioning. In another embodiment, the power supply selector 120 may be configured to also consider the various operating or power modes of the system 100 (e.g., "Low power", "Standby", "On", "Full-Power", etc.).

In such an embodiment, the high power portion 110 of the circuit 106 may be configured to operate using two or more power supplies. As such, the high power portion 110 may be referred to as a dual power circuit 110. In such an embodiment, the dual power circuit 110 may be powered by the signal 136. In turn, the signal 136 may be either the lower voltage Vdd 132 or the generally higher voltage Vdd_High 134, as determined by the power supply selector 120. Likewise, the low power portion 108 may be referred to as a single power circuit 108 as it only uses Vdd 132. It is understood that the above are merely a few illustrative examples to which the disclosed subject matter is not limited.

In such an embodiment, when there is a relatively large difference between the voltages of Vdd 132 and Vdd_High 134, the dual power circuit 110 may be powered by the higher voltage signal Vdd_High 134; therefore allowing the CLBs 104 and single power circuits 108 to enjoy the power saving that come with operating with the lower Vdd 132. However, if the voltage of Vdd 132 increases above the previously defined threshold value "V1" then the dual power circuit 110 will also be powered by the lower voltage signal Vdd 132. An alternate embodiment consists of monitoring the difference in voltages of the two signals 132 & 134, and if this difference is less than the threshold value (or other criteria), then the dual power circuit 110 may be powered by the lower voltage signal Vdd 132. In various embodiments, when the signal 136 and Vdd 132 are equal this may be referred to as "single-supply mode".

In various embodiments, the power supply selector 120 may be configured to switch between the two power supplies 122 & 124 dynamically during normal operation. In one such embodiment, the power supply selector 120 may be configured to only make a determination between the two power supplies 122 & 124 when the electrical circuit 102 first switches between two operating modes (e.g., standby to full-power, etc.). In another embodiment, the power supply selector 120 may be configured to switch between the two power supplies 122 & 124 repeatedly or a plurality of times while the device 100 stays within a single operating mode (e.g., full-power, etc.). For example, even if the device 100 is operating in a full-power or even a low-power mode, the power mode controller 126 may employ dynamic voltage shaping (DVS) to adjust the voltage of Vdd 132 based upon the processing load of the device 100. As the voltage of Vdd 132 crosses and possibly re-crosses the threshold voltage the power supply selector 120 uses to make its determination, the value of the signal 136 may dynamically change between Vdd 132 and Vdd_High 134. It is understood that the above is merely one illustrative example to which the disclosed subject matter is not limited.

In some embodiments, the second power supply 124 may be configured to not adjust the voltage of Vdd_High 134 as the voltage of Vdd 132 changes. In another embodiment, the second power supply 124 may be configured to stop adjusting the voltage of Vdd_High 134 if the power supply selector 120 has selected Vdd 132 as the power signal to be output as signal 136. In yet another embodiment, the second power supply 124 may be configured to stop generating Vdd_High 134 if the power supply selector 120 has selected Vdd 132 as the power signal to be output as signal 136. It is understood that the above are merely a few illustrative examples to which the disclosed subject matter is not limited.

In various embodiments, the power supply selector 120 may be included in the power supply 101 and/or the second power supply 124. In another embodiment, the power supply selector 120 may be included in the electrical circuit 102. In another embodiment, one or more, and possibly each dual power circuit 110 may include a version of the power supply selector 120. In yet another embodiment, memory circuit 106' may include one or more power supply selector 120. It is understood that the above are merely a few illustrative examples to which the disclosed subject matter is not limited.

Figure 2A:
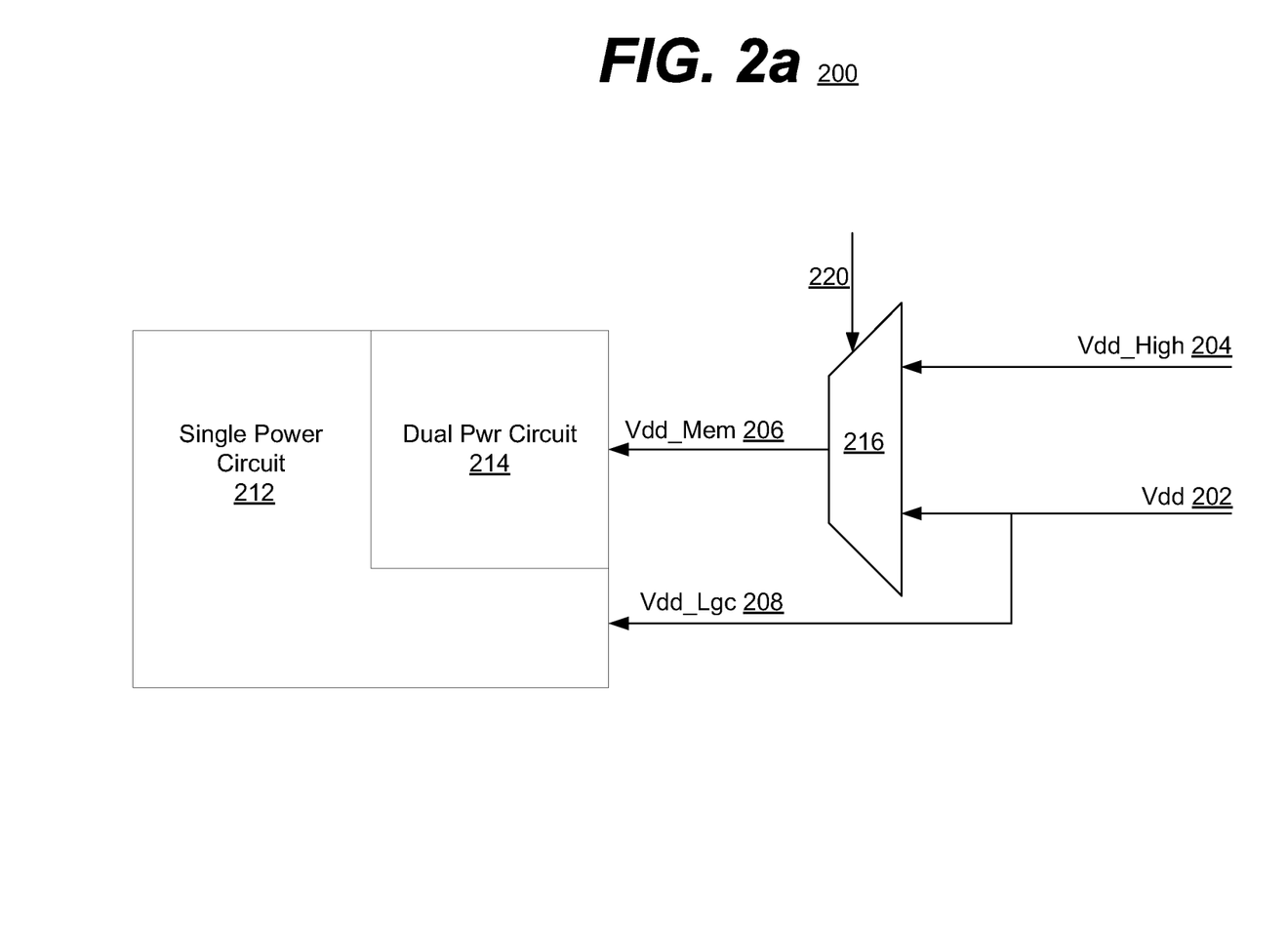
FIG. 2a is a block diagram of an example embodiment in accordance with the disclosed subject matter.

FIG. 2a is a block diagram of an example embodiment of a circuit 200 in accordance with the disclosed subject matter. In one embodiment, the circuit 200 may include a single power circuit 212, a dual power circuit 214, and a power supply selector 216. The power supply selector 216 may be controlled by a selection signal 220 that may be supplied by an external power mode controller (e.g., power mode controller 126 of FIG. 1, etc.). It is understood that the above is merely one illustrative example to which the disclosed subject matter is not limited.

As described above, in various embodiments, the circuit 200 may include a single power circuit 212 that is configured to be operated using only one power supply or a single power supply throughout its normal operation. However, it is understood that the voltage and/or frequency of that power supply may change based upon the operating or power mode (e.g., standby, low-power, full-power, etc.) of the circuit 200. In the illustrated embodiment, the single power circuit 212 may receive a signal referred to as Vdd_Lgc 208 and may be equal to Vdd 202. It is understood that the above is merely one illustrative example to which the disclosed subject matter is not limited.

As described above, in various embodiments, the circuit 200 may include a dual power circuit 214 that is configured to be operated using either a first or a second power supply. In such an embodiment, the second power supply may be configured to supply a power signal having a voltage equal to or greater than the first power supply. In such an embodiment, the dual power circuit 214 may receive the signal Vdd_Mem 206. As described above, in one embodiment, the signal Vdd_Mem 206 may either be equal to or include the signal Vdd_High 204 or the signal Vdd 202.

In the illustrated embodiment, the value or selection of the power supply may be done by the power supply selector 216. In the illustrated embodiment, the power supply selector 216 may include a multiplexer. The power supply selector 216 may select between the first power supply (Vdd 202) and the second power supply (Vdd_High 204), as described above. It is understood that the above is merely one illustrative example to which the disclosed subject matter is not limited.

In one embodiment, circuit 200 may be or include a Static Random Access Memory (SRAM) with an integrated power supply selector 216. The Single Power Circuit 212 could then include memory periphery logic such as memory control, address latches, and address decoder circuitry, etc. The Dual Power Circuit 214 would then represent wordline drivers and memory cells or memory bitcells. One advantage of integrating power supply selector 216 may be that the voltage difference between Vdd_Mem 206 and Vdd_Lgc 208 can be more carefully managed such that memory circuit 200 operates in a more optimal fashion.

Figure 2B:
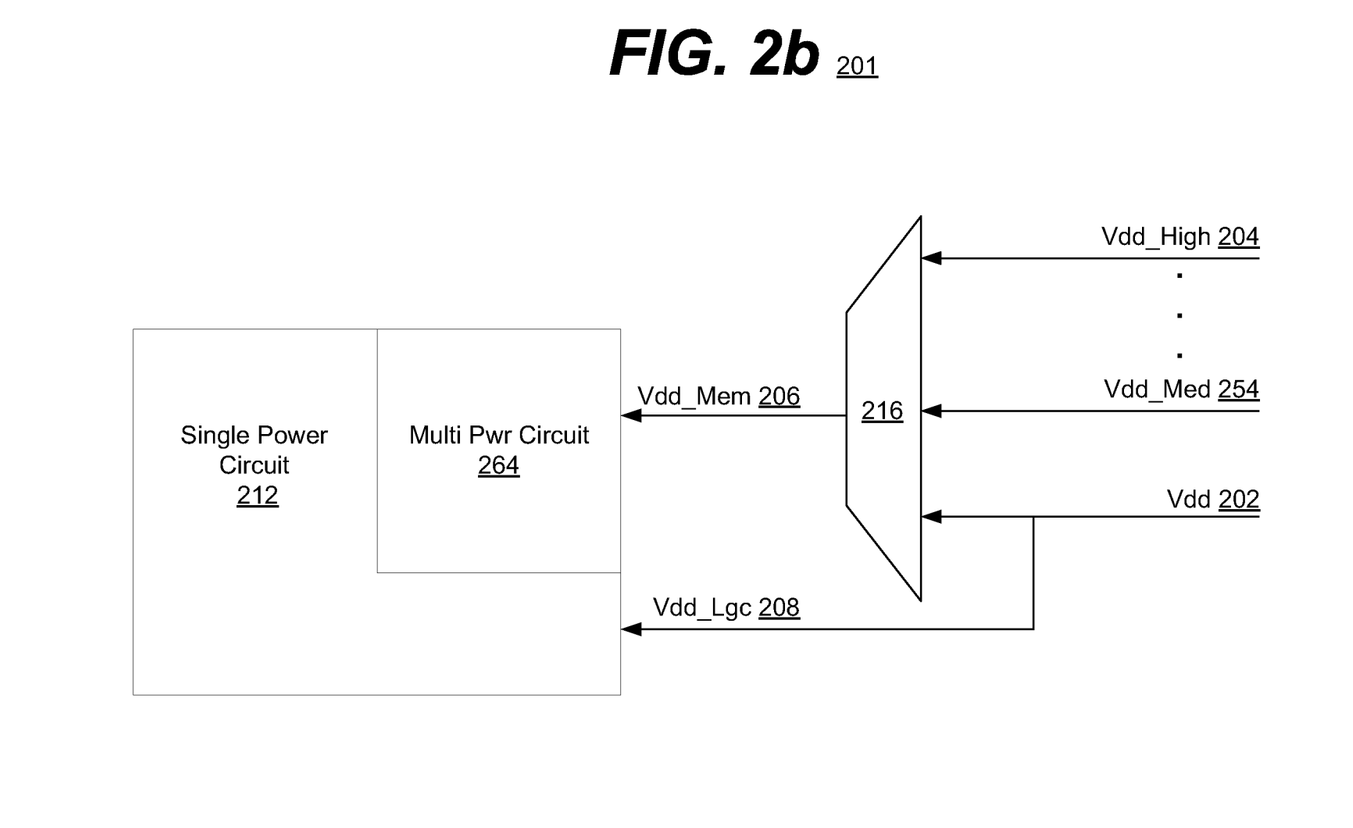
FIG. 2b is a block diagram of an example embodiment in accordance with the disclosed subject matter.

FIG. 2b is a block diagram of an example embodiment of a circuit 201 in accordance with the disclosed subject matter. In one embodiment, the circuit 200 may include a single power circuit 212, a multi-power circuit 264, and a power supply selector 216. In such an embodiment, the multi-power circuit 264 may be configured to operate via a plurality of different power supplies. It is understood that the above is merely one illustrative example to which the disclosed subject matter is not limited.

As described above, in various embodiments, the circuit 200 may include a single power circuit 212 that is configured to be operated using only one power supply or a single power supply throughout its operation. In the illustrated embodiment, the single power circuit 212 may receive a signal referred to as Vdd_Lgc 208 and may be equal to Vdd 202. It is understood that the above is merely one illustrative example to which the disclosed subject matter is not limited.

As described above, in various embodiments, the circuit 201 may include a multi-power circuit 214 that is configured to be operated using one of a plurality of power supplies. In such an embodiment, the second and subsequent power supplies (e.g., Vdd_Med 254, etc.) may be configured to supply a power signal having a voltage equal to or greater than the first power supply. In such an embodiment, the multi-power circuit 264 may receive the signal Vdd_Mem 206. In the illustrated embodiment, the signal Vdd_Mem 206 may either be equal to or include the signal Vdd_High 204, the signal Vdd_Med 254, or the signal Vdd 202. In the illustrated embodiment, the value or selection of the power supply may be done by the power supply selector 216. It is understood that the above is merely one illustrative example of three power supplies or voltage levels to which the disclosed subject matter is not limited.

Figure 2C:
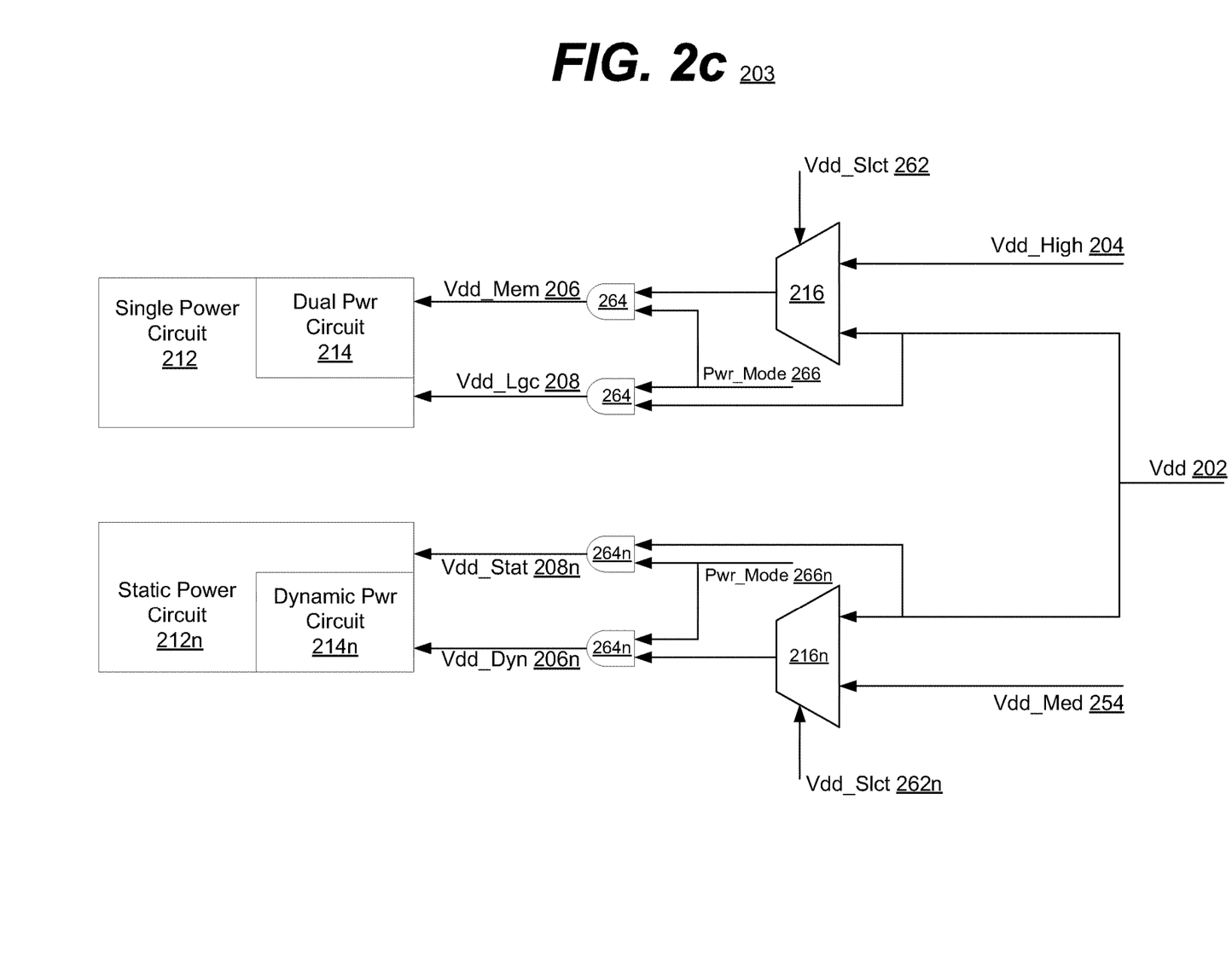
FIG. 2c is a block diagram of an example embodiment in accordance with the disclosed subject matter.

FIG. 2c is a block diagram of an example embodiment of a circuit 203 in accordance with the disclosed subject matter. The illustrated embodiment shows a version in which multiple portions of the circuit 203 operate or are powered by different power supplies. It is understood that the above is merely one illustrative example to which the disclosed subject matter is not limited.

In one embodiment, the circuit 203 may include a single power circuit 212, a dual power circuit 214, and a power supply selector 216, as described above. In such an embodiment, the power supply selector 216 may select between Vdd_High 204 and Vdd 202, as described above. In various embodiments, the power supply selector 216 may receive a control signal (Vdd_Slct) 262. In such an embodiment, the control signal 262 may be generated by various logic gates (not shown).

In the illustrated embodiment, the circuit 203 may include a second electrical circuit that is powered by multiple power supplies. In the illustrated embodiment, the electrical circuit may include a static power circuit 212n (analogous to the single power circuit 212), and a dynamic power circuit 214n (analogous to the dual power circuit 214). In various embodiments, the static power circuit 212n may receive the signal Vdd_Static 208n that is substantially equal to the signal Vdd 202. Conversely, the dynamic power circuit 214n may be configured to receive the signal Vdd_Dyn 206n that is either the signal Vdd 202 or the signal Vdd_Med 254, as determined by the power supply selector 216n and the control signal Vdd_Slct 262n.

In some embodiments, the dynamic power circuit 214n may receive the same signal as Vdd_Mem 206. In another embodiment, the signal Vdd_Static 208n may be either the signal Vdd 202 and the signal Vdd_High 204. However, the illustrated embodiment of circuit 203 highlights the ability for multiple circuits to receive individual or different power signals and to be controlled independently. It is understood that more uniform embodiments are possible.

In various embodiments, the circuit 203 may include a power or power mode controllers 264 & 264n. In the illustrated embodiment, these power mode controllers 264 & 264n are represented as AND gates for simplicity but more complex controllers may be employed. In the illustrated embodiment, if the signal Pwr_Mode 266 or Pwr_Mode 264n, respectively, are not asserted then the power signals to the circuits 212, 214, 212n, & 214n may be effectively turned off. In such an embodiment, the circuits 212, 214, 212n, & 214n may enter a low power or standby operating mode. In various embodiments, the circuit 203 may employ individualized power mode signals and controls for various groups of circuits or functional unit blocks (FUBs), such that some FUBs may be powered-down while others remain operational (e.g., one core of a multi-core processor may be turned off, a FPU unit may be turned off while a LSU may remain powered-up, etc.).

Figure 3:
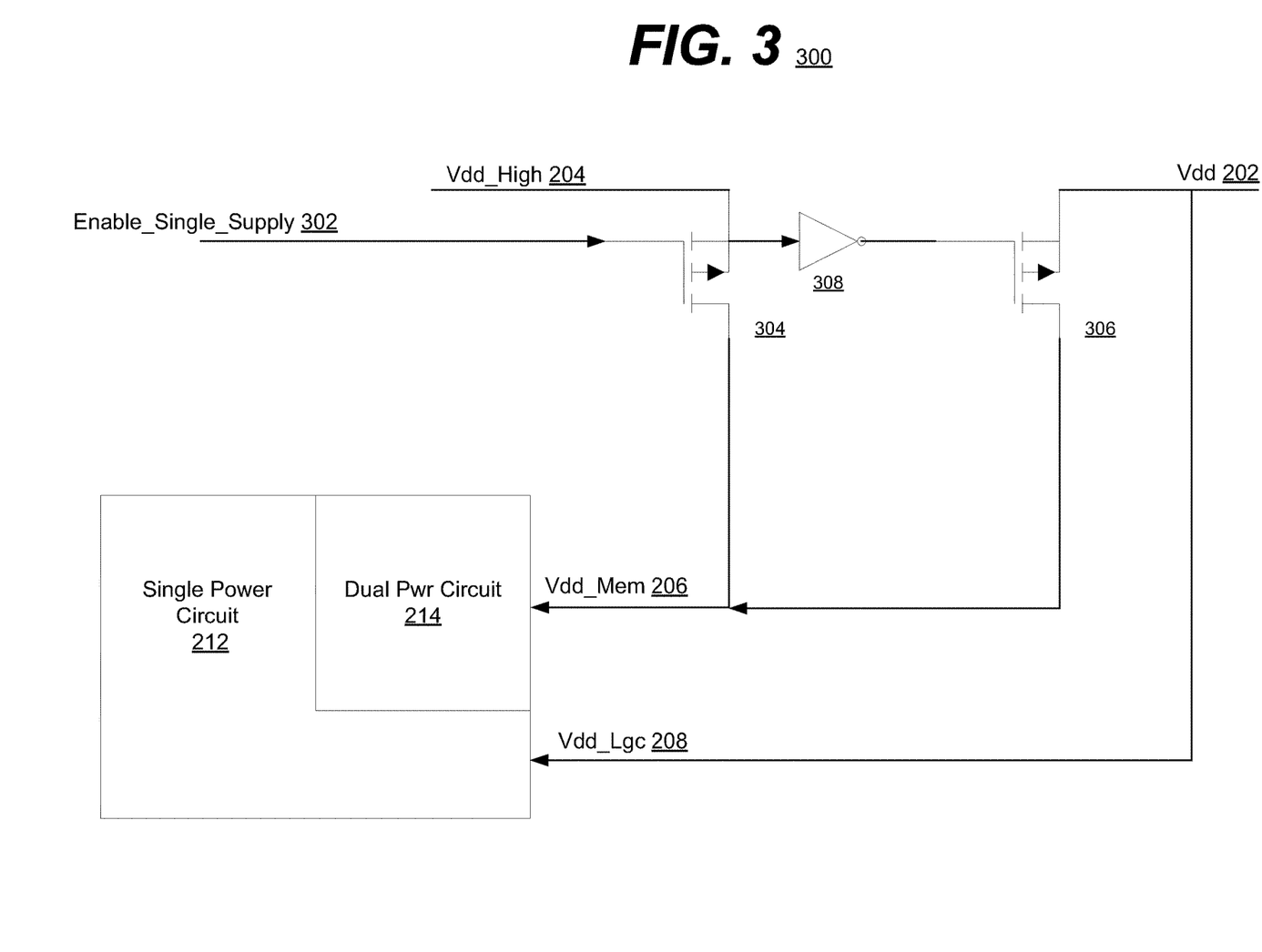
FIG. 3 is a block diagram of an example embodiment in accordance with the disclosed subject matter.

FIG. 3 is a block diagram of an example embodiment of a circuit 300 in accordance with the disclosed subject matter. In the illustrated embodiment, the circuit 300 may include a single power circuit 212 and a dual power circuit 214, as described above. In various embodiments, the circuit 300 may include the power signals Vdd 202 and Vdd_High 204, as described above.

In such an embodiment, the single power circuit 212 may receive the power signal Vdd_Lgc 208 that is substantially equal to the power signal Vdd 202, as described above. Likewise, the dual power circuit 214 may receive the power signal Vdd_Mem 206 that is substantially equal to either the signals Vdd 202 or Vdd_High 204, as dictated by the power supply selector.

In the illustrated embodiment, the power supply selector may include the transistors 304 and 306 (illustrated as, but not limited to, PMOS transistors) and the inverter 308. In one embodiment, the power supply selector may receive a control signal (Enable_Single_Supply) 302 that selects which power supply signal will become or will be electrically coupled with the dual power circuit 214. In the illustrated embodiment, when the control signal 302 is low or off, the transistor 304 electrically couples the signal Vdd_High 204 with the dual power circuit 214, and the transistor 306 electrically decouples the signal Vdd 202 from the dual power circuit 214. Conversely, when the control signal 302 is high or on, the transistor 304 electrically decouples the signal Vdd_High 204 from the dual power circuit 214, and the transistor 306 electrically couples the signal Vdd 202 with the dual power circuit 214. In various embodiments, the inverter 308 may be employed to turn transistor 306 off when transistor 304 is on, and vice versa. In the exemplary illustrated embodiment, the transistors 304 and 306 are illustrated as including PMOS transistors, but it is understood that the circuit could be embodied via a variety of forms, such as, for example, NMOS transistors, or even non-field effect (FET) transistors. It is understood that the above are merely a few illustrative examples to which the disclosed subject matter is not limited.

Figure 4:
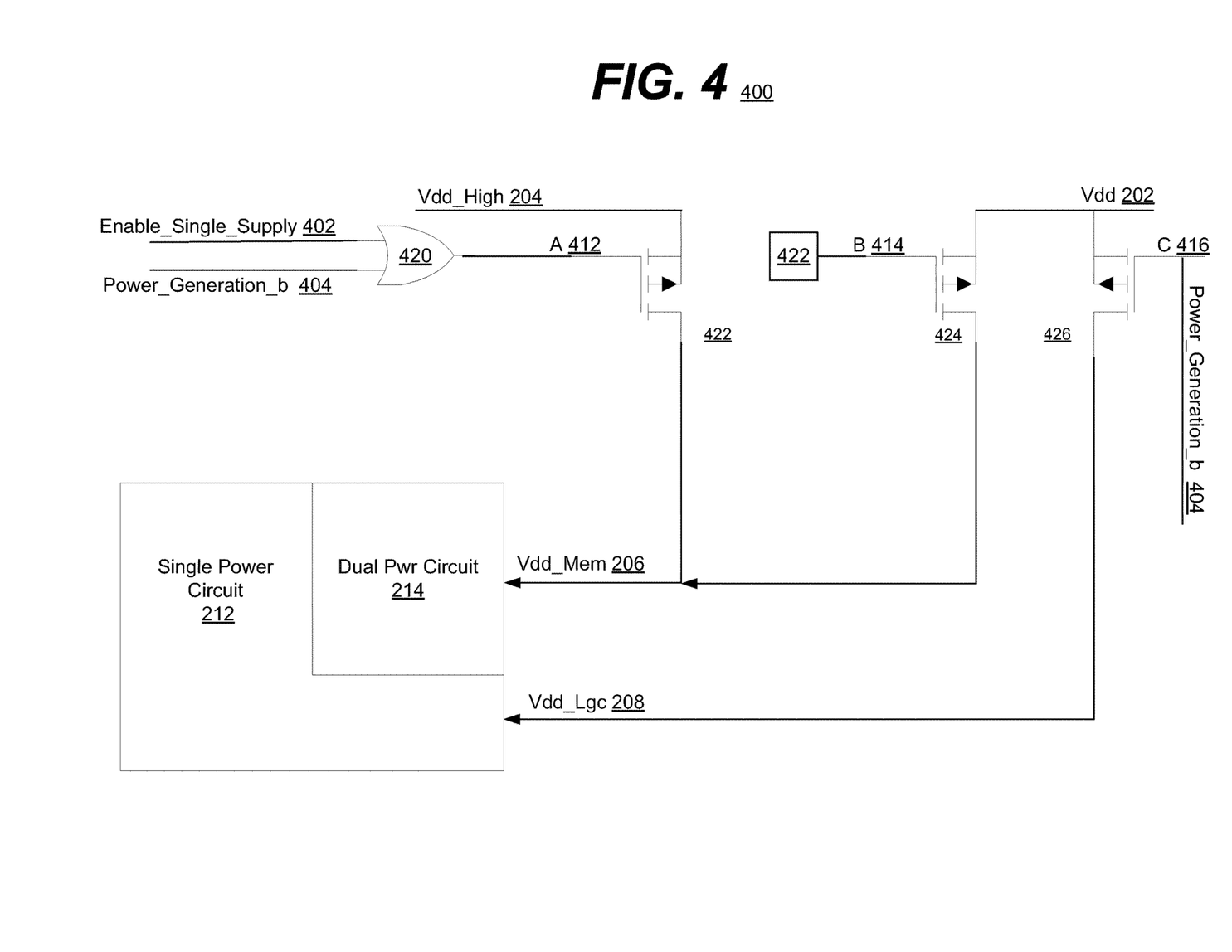
FIG. 4 is a block diagram of an example embodiment in accordance with the disclosed subject matter.

FIG. 4 is a block diagram of an example embodiment of a circuit 400 in accordance with the disclosed subject matter. In the illustrated embodiment, the system 400 may include a single power circuit 212 and a dual power circuit 214, as described above. In various embodiments, the system 400 may include the power supply signals Vdd 202 and Vdd_High 204, as described above. In addition, the system may include an operating mode or power mode controller (illustrated in part as OR gate 420) that is configured to place the circuits 212 & 214 in two or more operating or power modes, irrespective of the selection between the power signals Vdd 202 and Vdd_High 204.

In the illustrated embodiment, the power supply selector may include two transistors: transistor A 412, and transistor B 414. However, unlike circuit 300 of FIG. 3, the power supply selector may also include or be integrated with the power mode controller. In such an embodiment, the power mode controller may include the logic gates 420 and 422, and transistor C 416. In the illustrated embodiment, the power mode controller selects between two operating modes, "on" and "off" or "low-power" and "full-power", in which the circuits 212 & 214 either receive power or they don't. In the exemplary illustrated embodiment, the transistors 412 and 414 are illustrated as including PMOS transistors, but it is understood that the circuit could be embodied via a variety of forms, such as, for example, NMOS transistors, or even non-field effect (FET) transistors. It is understood that the above are merely illustrative examples to which the disclosed subject matter is not limited.

In various embodiments, the portion of the power mode controller controlling the single power circuit 212 may include transistor C 416. In the illustrated embodiment, if the operating mode control signal (Power_Generation_b) 404 is "low", transistor C 416 turns "on" and electrically couples Vdd 202 with the single power circuit 212, placing it in an "on" or "full-power" mode. Conversely, when the operating mode control signal (Power_Generation_b) 404 is "high", transistor C 416 turns "off" and electrically decouples Vdd 202 from the single power circuit 212, placing it in an "off" or "low-power" mode.

In one embodiment, the portion of the power mode controller controlling the dual power circuit 214 may influence or be integrated with the power supply selector (transistors A 412 & B 414) and be more complex. In such an embodiment, the resultant Vdd_Mem 206 may be based upon both the desired operating mode and the voltage differential between the two power signals Vdd 202 and Vdd_High 204. In such an embodiment, the logic controlling the transistors A 412 & B 414 may be configured to assure that both transistors A 412 & B 414 are not on at the same time. However, in various embodiments, both transistors A 412 & B 414 may be off at the same time.

In the illustrated embodiment, the logic controlling transistor A 412 may include an OR gate 420 that takes both the power supply control signal (Enable_Single_Supply) 402 and the operating mode control signal (Power_Generation_b) 404 as input. In such an embodiment, the transistor A 412 may be configured to electrically couple Vdd_High 204 with the dual power circuit 214 if both control signals are "low".

Likewise, in various embodiments, the logic 422 controlling transistor B 414 take both the power supply control signal (Enable_Single_Supply) 402 and the operating mode control signal (Power_Generation_b) 404 as input. However, as transistor B 414 needs to be "off" if transistor A 412 is "on" the transistor B 414 may be configured to electrically couple Vdd 202 with the dual power circuit 214 if control signal 404 is "off" (logic level is low) and control signal 402 is "on" (logic level is high). Logic 422 will generate an "off" (logic level is low) signal if control signal 404 is off and control signal 402 is on. Note that the PMOS transistor B 414 is conducting if its gate input has an "off" (logic level is low) input.

It is understood that the above are merely a few illustrative examples to which the disclosed subject matter is not limited. In various embodiments, the power mode controller may be configured to alter the voltage and/or frequency of the various power signals (e.g., signals 202 & 204, etc.). In some such embodiments, the power mode controller may be included in the power supply or voltage regulators (not shown).

Figure 5:
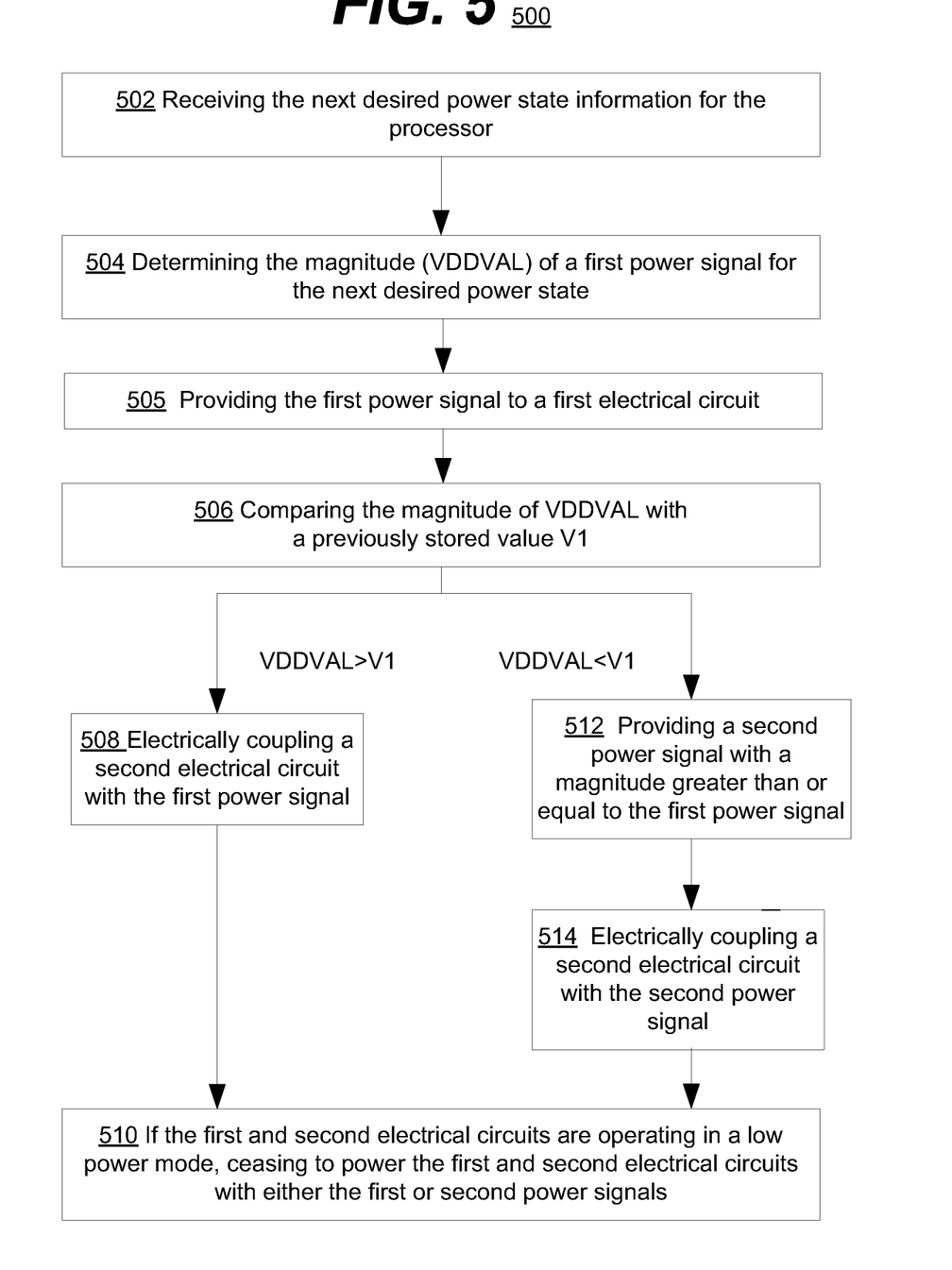
FIG. 5 is a flowchart of an example embodiment in accordance with the disclosed subject matter.

FIG. 5 is a flow chart of an example embodiment of a technique in accordance with the disclosed subject matter. In various embodiments, the technique 500 may be used or produced by the systems such as those of FIG. 1 or 6. Furthermore, portions of technique 500 may be used or produced by the systems such as that of FIG. 2a, 2b, or 2c, while another portion of technique 500 may be used or produced by the systems such as that of FIG. 3 or 4. Although, it is understood that the above are merely a few illustrative examples to which the disclosed subject matter is not limited. It is understood that the disclosed subject matter is not limited to the ordering of or number of actions illustrated by technique 500.

Block 502 illustrates that, in one embodiment, a signal may be received that indicates a next power state, as described above. In various embodiments, this may be the next desired power state of a processor, as described above. In various embodiments, one or more of the action(s) illustrated by this Block may be performed by the apparatuses or systems of FIG. 1, 2a, 2b, 2c, 3, 4, or 6, the power mode controller 126 or power supply 101 of FIG. 1, as described above.

Block 504 illustrates that, in one embodiment, a magnitude of a first power signal associated with the next power state may be determined, as described above. In one embodiment, the magnitude of the first power signal may dynamically change, as described above. In various embodiments, one or more of the action(s) illustrated by this Block may be performed by the apparatuses or systems of FIG. 1, 2a, 2b, 2c, 3, 4, or 6, the power mode controller 126 or power supply 101 of FIG. 1, as described above.

Block 505 illustrates that, in one embodiment, a first electrical circuit may be powered or provided with the first power signal, as described above. In various embodiments, the first electrical circuit may include a first portion of a memory and a second electrical circuit may include a second portion of the memory, as described above. In various embodiments, one or more of the action(s) illustrated by this Block may be performed by the apparatuses or systems of FIG. 1, 2a, 2b, 2c, 3, 4, or 6, the power supply 101 of FIG. 1, the single, static, or periphery power circuits of 1, 2a, 2b, 2c, 3, or 4, as described above.

Block 506 illustrates that, in one embodiment, the magnitude of the first power signal may be compared to a predetermined magnitude level, as described above. In another embodiment, the magnitude of the first power signal may be compared to a second power signal, as described above. In various embodiments, one or more of the action(s) illustrated by this Block may be performed by the apparatuses or systems of FIG. 1, 2a, 2b, 2c, 3, 4, or 6, the power mode controller 126 or power supply 101 of FIG. 1, as described above.

Blocks 508, 512, and 514 illustrate that, in one embodiment, a second electrical circuit may be dynamically electrically coupled with either the first power signal or a second power signal, as described above. In various embodiments, this may occur based at least in part upon the magnitude of the first power signal compared to a predetermined magnitude level, as described above. Block 508 illustrates that, in one embodiment, the second electrical circuit may be coupled with the first power signal, if the magnitude of the first power is below a certain threshold or relative value, as described above. Block 512 illustrates that, in one embodiment, a second power signal may be provided with a magnitude greater than or equal to the first power signal, as described above. Block 514, illustrates that, in one embodiment, the second electrical circuit may be coupled with the second power signal, if the magnitude of the first power is above (or equal to) a certain threshold or relative value, as described above.

In various embodiments, dynamically electrically coupling a second electrical circuit with either the first power signal or a second power signal may include generating a selector control signal based upon definitions of each of a plurality of power states, as described above. In such an embodiment, each definition may include an operating frequency and a voltage of the first power signal during the respective power state, as described above.

In another embodiment, the magnitude of the first power signal may dynamically change, as described above. In such an embodiment, dynamically electrically coupling a second electrical circuit with either the second power signal or the first power signal may include switching between the either the second power signal or the first power signal, based, at least in part, upon the dynamic change in the magnitude of the first power signal, as described above.

In yet another embodiment, dynamically electrically coupling may include receiving a first electrical signal that indicates a voltage of the first power signal during the next power state, and receiving a second electrical signal that indicates a voltage of the second power signal during the next power state, as described above. In various embodiments, one or more of the action(s) illustrated by this Block may be performed by the apparatuses or systems of FIG. 1, 2a, 2b, 2c, 3, 4, or 6, the power mode controller 126 or power supply 101 of FIG. 1, the dual, dynamic, muti- or bitcell/wordline power circuits of 1, 2a, 2b, 2c, 3, or 4, as described above.

Block 510 illustrates that, in one embodiment, if the first electrical circuit is operating in a low power mode, one may cease to power the first electrical circuit with the first power signal, as described above. In such an embodiment, if the second electrical circuit is operating in a low power mode, the second electrical circuit may be dynamically electrically decoupled from both the second power signal, and the first power signal, as described above. In various embodiments, one or more of the action(s) illustrated by this Block may be performed by the apparatuses or systems of FIG. 1, 2a, 2b, 2c, 3, 4, or 6, the power mode controller 126 or power supply 101 of FIG. 1, as described above.

Figure 6:
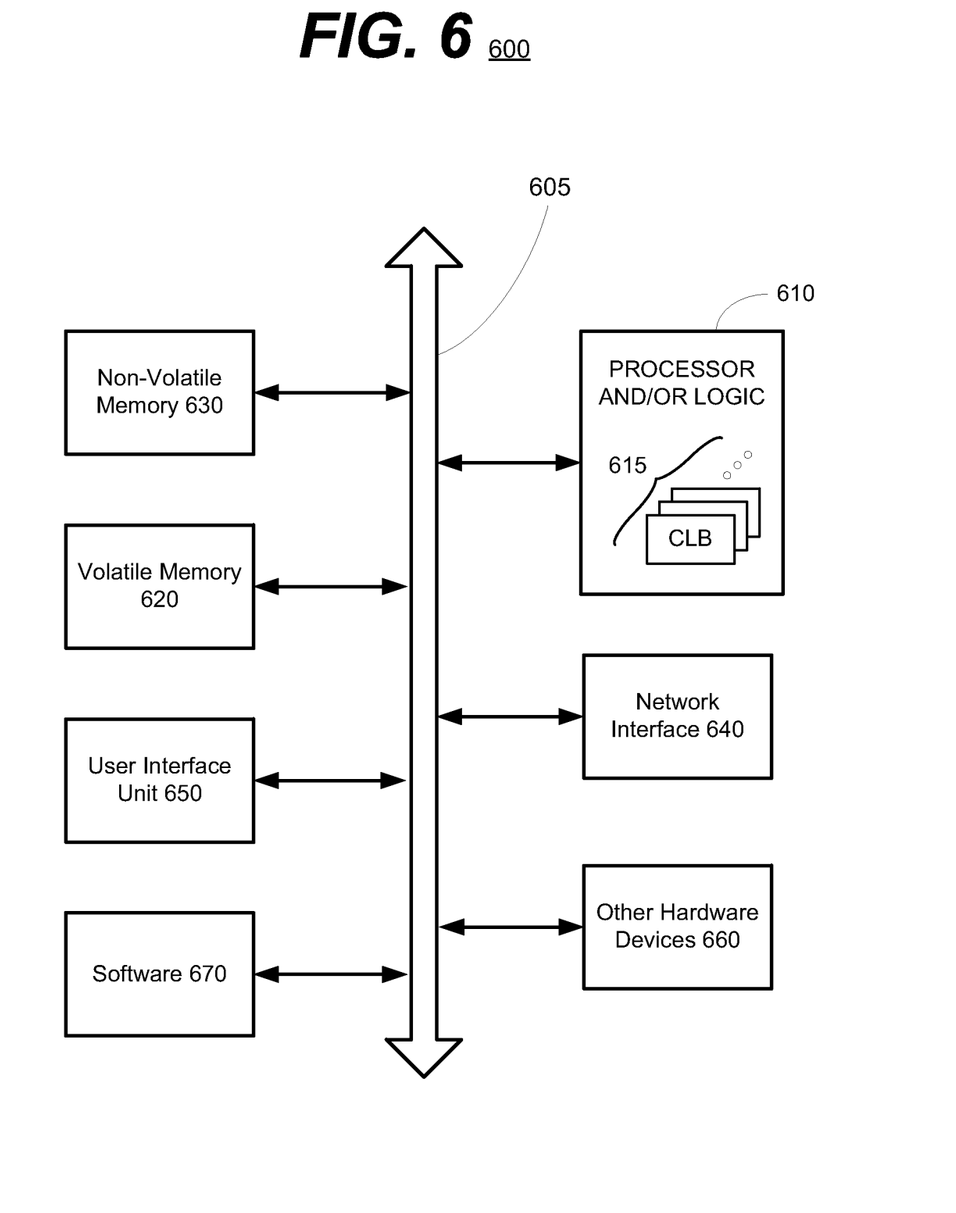
FIG. 6 is a schematic block diagram according to principles of the disclosed subject matter.

FIG. 6 is a schematic block diagram of an information processing system 600 that may include semiconductor devices formed according to principles of the disclosed subject matter.

Referring to FIG. 6, an information processing system 600 may include one or more of devices constructed according to the principles of the disclosed subject matter. In another embodiment, the information processing system 600 may employ or execute one or more techniques according to the principles of the disclosed subject matter.

In various embodiments, the information processing system 600 may include a computing device, such as, for example, a laptop, desktop, workstation, server, blade server, personal digital assistant, smartphone, tablet, and other appropriate computers, etc. or a virtual machine or virtual computing device thereof. In various embodiments, the information processing system 600 may be used by a user (not shown).

The information processing system 600 according to the disclosed subject matter may further include a central processing unit (CPU), logic, or processor 610. In some embodiments, the processor 610 may include one or more functional unit blocks (FUBs) or combinational logic blocks (CLBs) 615. In such an embodiment, a combinational logic block may include various Boolean logic operations (e.g., NAND, NOR, NOT, XOR, etc.), stabilizing logic devices (e.g., flip-flops, latches, etc.), other logic devices, or a combination thereof. These combinational logic operations may be configured in simple or complex fashion to process input signals to achieve a desired result. It is understood that while a few illustrative examples of synchronous combinational logic operations are described, the disclosed subject matter is not so limited and may include asynchronous operations, or a mixture thereof. In one embodiment, the combinational logic operations may comprise a plurality of complementary metal oxide semiconductors (CMOS) transistors. In various embodiments, these CMOS transistors may be arranged into gates that perform the logical operations; although it is understood that other technologies may be used and are within the scope of the disclosed subject matter.

The information processing system 600 according to the disclosed subject matter may further include a volatile memory 620 (e.g., a Random Access Memory (RAM), etc.). The information processing system 600 according to the disclosed subject matter may further include a non-volatile memory 630 (e.g., a hard drive, an optical memory, a NAND or Flash memory, etc.). In some embodiments, either the volatile memory 620, the non-volatile memory 630, or a combination or portions thereof may be referred to as a "storage medium". In various embodiments, the volatile memory 620 and/or the non-volatile memory 630 may be configured to store data in a semi-permanent or substantially permanent form.

In various embodiments, the information processing system 600 may include one or more network interfaces 640 configured to allow the information processing system 600 to be part of and communicate via a communications network. In various embodiments, examples of a Wi-Fi protocol may include, but are not limited to: Institute of Electrical and Electronics Engineers (IEEE) 802.11g, IEEE 802.11n, etc. Examples of a cellular protocol may include, but are not limited to: IEEE 802.16m (a.k.a. Wireless-MAN (Metropolitan Area Network) Advanced), Long Term Evolution (LTE) Advanced), Enhanced Data rates for GSM (Global System for Mobile Communications) Evolution (EDGE), Evolved High-Speed Packet Access (HSPA+), etc. Examples of a wired protocol may include, but are not limited to: IEEE 802.3 (a.k.a. Ethernet), Fibre Channel, Power Line communication (e.g., HomePlug, IEEE 1901, etc.), etc. It is understood that the above are merely a few illustrative examples to which the disclosed subject matter is not limited.

The information processing system 600 according to the disclosed subject matter may further include a user interface unit 650 (e.g., a display adapter, a haptic interface, a human interface device, etc.). In various embodiments, this user interface unit 650 may be configured to either receive input from a user and/or provide output to a user. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

In various embodiments, the information processing system 600 may include one or more other devices or hardware components 660 (e.g., a display or monitor, a keyboard, a mouse, a camera, a fingerprint reader, a video processor, etc.). It is understood that the above are merely a few illustrative examples to which the disclosed subject matter is not limited.

The information processing system 600 according to the disclosed subject matter may further include one or more system buses 605. In such an embodiment, the system bus 605 may be configured to communicatively couple the processor 610, the volatile memory 620, the non-volatile memory 630, the network interface 640, the user interface unit 650, and one or more hardware components 660. Data processed by the processor 610 or data inputted from outside of the non-volatile memory 630 may be stored in either the non-volatile memory 630 or the volatile memory 620.

In various embodiments, the information processing system 600 may include or execute one or more software components 670. In some embodiments, the software components 670 may include an operating system (OS) and/or an application. In some embodiments, the OS may be configured to provide one or more services to an application and manage or act as an intermediary between the application and the various hardware components (e.g., the processor 610, a network interface 640, etc.) of the information processing system 600. In such an embodiment, the information processing system 600 may include one or more native applications, which may be installed locally (e.g., within the non-volatile memory 630, etc.) and configured to be executed directly by the processor 610 and directly interact with the OS. In such an embodiment, the native applications may include pre-compiled machine executable code. In some embodiments, the native applications may include a script interpreter (e.g., C shell (csh), AppleScript, AutoHotkey, etc.) or a virtual execution machine (VM) (e.g., the Java Virtual Machine, the Microsoft Common Language Runtime, etc.) that are configured to translate source or object code into executable code which is then executed by the processor 610.

The semiconductor devices described above may be encapsulated using various packaging techniques. For example, semiconductor devices constructed according to principles of the disclosed subject matter may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique, a wafer-level processed stack package (WSP) technique, or other technique as will be known to those skilled in the art.

Method steps may be performed by one or more programmable processors executing a computer program to perform functions by operating on input data and generating output. Method steps also may be performed by, and an apparatus may be implemented as, special purpose logic circuitry, e.g., an FPGA (field programmable gate array) or an ASIC (application-specific integrated circuit).

While the principles of the disclosed subject matter have been described with reference to example embodiments, it will be apparent to those skilled in the art that various changes and modifications may be made thereto without departing from the spirit and scope of these disclosed concepts. Therefore, it should be understood that the above embodiments are not limiting, but are illustrative only. Thus, the scope of the disclosed concepts are to be determined by the broadest permissible interpretation of the following claims and their equivalents, and should not be restricted or limited by the foregoing description. It is, therefore, to be understood that the appended claims are intended to cover all such modifications and changes as fall within the scope of the embodiments.

What is claimed is:

1. An apparatus comprising:
a first power supply configured to generate a first power signal having one of a plurality of voltages based upon a selected power state;
a second power supply configured to simultaneously generate a second power signal that includes a second voltage higher than a first voltage of the first power signal, and a third power signal that includes a third voltage that is higher than the first voltage of the first power signal and less than the second voltage of the second power signal;
a first electrical circuit configured to be powered by the first power signal;
a second electrical circuit configured to be powered by either the first power signal, the second power signal, or the third power signal;
a power mode controller configured to:
receive a signal indicating a next power state,
determine the voltage of the first power signal during the next power state, and
generate a selector control signal based upon a comparison of the voltage of the first power signal during the next power state to a predefined voltage level; and
a power supply selector configured to dynamically electrically couple the second electrical circuit with either the first power signal, the second power signal, or the third power signal, based at least in part upon the selector control signal;
wherein the power supply selector is configured to:
dynamically electrically couple the second electrical circuit with the first power supply if a difference between the voltage of the first power signal and the voltage of the second power signal becomes lower than a threshold amount, and
dynamically electrically couple the second electrical circuit with the second power supply if the difference between the voltage of the first power signal and the voltage of the second power signal, becomes greater than the threshold amount.

2. The apparatus of claim 1, wherein the first electrical circuit includes a first portion of a memory and the second electrical circuit includes a second portion of the memory.

3. The apparatus of claim 1, wherein the power mode controller is configured to generate the selector control signal based upon definitions of each of a plurality of power states, wherein each definition includes one or more of an operating frequency, a voltage of the first power signal during the respective power state, and a voltage of the second power signal during the respective power state.

4. The apparatus of claim 1, further comprising a storage unit configured to store definitions of each of a plurality of power states, wherein each definition includes one or more of an operating frequency, a voltage of the first power signal during the respective power state, and a voltage of the second power signal during the respective power state.

5. The apparatus of claim 4, wherein at least part of the definition of the plurality of power states are determined during a testing period of the apparatus.

6. The apparatus of claim 1, wherein the first power supply is configured to dynamically adjust, based upon a selected power state, an operating frequency and the voltage of the first power signal.

7. The apparatus of claim 1, wherein the power supply selector is configured to:
dynamically electrically decouple the second electrical circuit from both the first power supply and the second power supply if the second electrical circuit is operating in a low power mode; and
if the second electrical circuit is operating in a single supply mode, dynamically electrically decouple the second electrical circuit from the second power supply, and dynamically electrically couple the first electrical circuit with the first power supply.

8. The apparatus of claim 1, wherein the apparatus includes:
one or more combinatorial logic blocks configured to be powered by the first power supply; and
wherein the power mode controller is further configured to dynamically adjust the voltage of the first power supply based upon the selected power state.

9. A method comprising:
receiving a signal that indicates a next power state;
simultaneously generating a first power signal, a second power signal, and a third power signal, each having different voltages;
determining a magnitude of the first power signal associated with the next power state;
powering a first electrical circuit with the first power signal;
comparing the magnitude of the first power signal to at least one predetermined magnitude level; and
dynamically electrically coupling a second electrical circuit with either the first power signal, the second power signal, or the third power signal, based at least in part upon the magnitude of the first power signal compared to the at least one predetermined magnitude level;
wherein the magnitude of the first power signal dynamically changes; and
wherein dynamically electrically coupling a second electrical circuit with either the second power signal or the first power signal includes switching between either the second power signal or the first power signal, based, at least in part, upon the dynamic change in the magnitude of the first power signal.

10. The method of claim 9, wherein the first electrical circuit includes a first portion of a memory and the second electrical circuit includes a second portion of the memory.

11. The method of claim 9, wherein dynamically electrically coupling a second electrical circuit with either the first power signal or a second power signal comprises:
generating a selector control signal based upon definitions of each of a plurality of power states, wherein each definition includes one or more of an operating frequency and a voltage of the first power signal during the respective power state.

12. The method of claim 9, wherein dynamically electrically coupling includes:
receiving a first electrical signal that indicates a voltage of the first power signal during the next power state, and
receiving a second electrical signal that indicates a voltage of the second power signal during the next power state.

13. The method of claim 9, further including, if the first electrical circuit is operating in a low power mode, ceasing to power the first electrical circuit with the first power signal; and
if the second electrical circuit is operating in a low power mode, dynamically electrically decoupling the second electrical circuit from both the second power signal, and the first power signal.

14. A system comprising:
a power supply comprising:
a first power generator configured to generate a first power signal having one of a plurality of voltages based upon a selected power state,
a second power generator configured to generate a second power signal that includes a voltage higher than a voltage of the first power signal, and
a third power generator configured to generate a third power signal that includes a voltage higher than the voltage of the first power signal and less than the voltage of the second power signal,
wherein power supply outputs the first power signal, the second power signal, and the third power signal substantially simultaneously;
a memory comprising:
a first portion of the memory configured to be powered by the first power signal, and
a second portion of the memory configured to be powered by either the third power signal, the second power signal, or the first power signal;
a power mode controller configured to:
receive a signal indicating a next power state,
determine the voltage of the first power signal during the next power state, and
generate a selector control signal based upon a comparison of the voltage of the first power signal during the next power state to a predefined voltage level; and
a power supply selector configured to dynamically electrically couple the second portion of the memory with either the third power signal, the second power signal, or the first power signal, based at least in part upon the selector control signal; and
wherein the power supply selector is configured to:
dynamically electrically couple the second portion with the second power signal if the voltage of the first power signal becomes lower than a threshold amount compared to the voltage of the second power signal; and
dynamically electrically couple the second portion with the first power signal if the voltage of the first power signal becomes greater than the threshold amount compared to the voltage of the second power signal.

15. The system of claim 14, wherein the system includes a combinatorial logic block configured to be powered by the first power signal.

16. The system of claim 14, wherein the power supply includes the power supply selector.

17. The system of claim 14, wherein the power mode controller is configured to, when memory is placed in a low power mode:
 electrically decouple the first portion of the memory from the first power signal, and
 electrically decouple the second portion of the memory from both the second power signal and the first power signal.

18. The system of claim 14, wherein the power mode controller is configured to generate the selector control signal based upon definitions of each of a plurality of power states, wherein each definition includes: an operating frequency, a voltage of the first power signal during the respective power state, and a voltage of the second power signal during the respective power state.

19. The system of claim 14, further comprising storage configured to store definitions of each of a plurality of power states, wherein each definition includes: an operating frequency and a voltage of the first power signal during the respective power state.

20. An apparatus comprising:
 a first power supply configured to generate a first power signal;
 a second power supply configured to generate a second power signal that includes a voltage higher than a voltage of the first power signal;
 a third power supply configured to generate a third power signal that includes a voltage higher than the voltage of the first power signal, and less than the voltage of the second power signal;
 wherein the first power signal, the second power signal, and the third power signal are output substantially simultaneously
 a first electrical circuit configured to be powered by the first power supply;
 a second electrical circuit configured to be powered by either the third power signal, the second power signal, or the first power signal;
 one or more power supply selectors configured to dynamically electrically couple the second electrical circuit with either the first power signal, the second power signal, or the third power signal, based at least in part upon the voltage of the first power signal;
 wherein at least one of the power supply selectors is configured to:
  dynamically electrically couple the second electrical circuit with the second power supply if the voltage of the first power signal becomes lower than a threshold amount compared to the voltage of the second power signal; and
  dynamically electrically couple the second electrical circuit with the first power supply if the voltage of the first power signal becomes greater than the threshold amount compared to the voltage of the second power signal.

21. The apparatus of claim 20, wherein the first electrical circuit includes a first portion of a static random access memory and the second electrical circuit includes a second portion of the static random access memory, wherein the second portion includes a wordline.

22. The apparatus of claim 20, wherein a power supply selector is configured to dynamically switch between the first power supply and the second power supply during a full-power operation mode of the second electrical circuit.

23. The apparatus of claim 20, wherein the first power supply is configured to dynamically adjust, based upon a selected power state, an operating frequency and the voltage of the first power signal.

24. The apparatus of claim 20, wherein a power supply selector is configured to:
 dynamically electrically decouple the second electrical circuit from both the first power supply and the second power supply if the second electrical circuit is operating in a low power mode; and
 if the second electrical circuit is operating in a single supply mode, dynamically electrically decouple the second electrical circuit from the second power supply, and dynamically electrically couple the first electrical circuit with the first power supply.

25. The apparatus of claim 20, wherein the apparatus includes:
 one or more combinatorial logic blocks configured to be powered by the first power supply.

26. The apparatus of claim 20, wherein the apparatus includes:
 a power mode controller configured to dynamically adjust the voltage of the first power supply based upon a selected power state.

27. The apparatus of claim 20, wherein the first electrical circuit, the second electrical circuit, and one or more power supply selectors are physically contiguous to each other such that at least one power supply selector is located no farther than 50 microns from portions of the first and second electrical circuits.

* * * * *